(12) United States Patent
Jost

(10) Patent No.: US 6,509,066 B1
(45) Date of Patent: Jan. 21, 2003

(54) SENSITIZED PHOTOCONDUCTIVE INFRARED DETECTORS

(75) Inventor: Steven Jost, Amherst, NH (US)

(73) Assignee: BAE Systems Information and Electronic Systems Integration Inc., Nashua, NH (US)

(*) Notice: Subject to any disclaimer, the term of this patent is extended or adjusted under 35 U.S.C. 154(b) by 34 days.

(21) Appl. No.: 09/819,384

(22) Filed: Mar. 29, 2001

Related U.S. Application Data

(60) Provisional application No. 60/201,214, filed on May 2, 2000.

(51) Int. Cl.[7] .............................................. C23C 14/24
(52) U.S. Cl. ..................... 427/529; 427/530; 427/160; 427/255.11; 427/255.31; 427/255.35
(58) Field of Search ........................ 427/255.31, 255.35, 427/255.11, 530, 529, 160

(56) References Cited

U.S. PATENT DOCUMENTS 3,647,197 A  *  3/1972  Holloway ................... 118/726
3,716,424 A  *  2/1973  Schoolar ...................... 117/84
5,410,452 A     4/1995  Sinclair et al.

FOREIGN PATENT DOCUMENTS

JP          61-075371       *   4/1986

* cited by examiner

Primary Examiner—Timothy Meeks
(74) Attorney, Agent, or Firm—Salzman & Levy

(57) ABSTRACT

A series of processes have been discovered whereby uniform oxygen doping of lead chalcogenides have been achieved by using vapor deposition combined with in situ or ex situ ion implantation allowing the high yield manufacture of high S/N infrared detectors.

16 Claims, No Drawings

SENSITIZED PHOTOCONDUCTIVE INFRARED DETECTORS

RELATED APPLICATIONS

This application claims priority to Provisional Patent Application Ser No. 60/201,214, filed May 2, 2000.

FIELD OF THE INVENTION

The present invention relates to a family of lead chalcogenide photo-semiconductors (photoconductors) and, more particularly, to photoconductors having essentially homogeneous oxygen-containing shallow electron traps impregnated throughout the photodiode matrix.

BACKGROUND OF THE INVENTION

It is well understood that mankind's perception of the "real world" is limited to the extent of our five senses. For example, although electromagnetic radiation is in the form of gamma rays or microwaves, these radiations are not detectable to us unless some means is available to convert them into a perceptible form of radiation or other sensory stimuli (e.g., visible light, sound, heat, or physical contact). Fortunately, technology has developed materials, apparatus, and devices that can transform one form of electromagnetic radiation to another form of electromagnetic radiation. Typically, this is achieved by converting the radiation into electrical energy, which is then transformed back into electromagnetic radiation in another region of the spectrum. With the advent of semiconductor technology, these transformations can be readily performed.

One such device for converting electromagnetic radiation into electrical energy is a photo-semiconductor (photocoductor). Essentially, a photoconductor absorbs photons of electromagnetic radiation, thereby altering the conductivity of the radiation absorbing media in the photoconductor to generate a change in electrical current.

Similarly, a change in voltage can be created by using a photovoltaic cell which establishes a quantitative relationship between the impinging electromagnetic radiation and electrical current or voltage. The electrical current can then be converted back into a form of energy that can be perceived (i.e., sound, visible light, heat, movement, hard copy printout, etc.). Examples of components for converting electrical energy into other forms of energy include audio amplifiers, cathode ray tubes, light emitting diodes, semiconductor lasers, resistors, and transponders.

One very useful form of electromagnetic radiation is infrared radiation or infrared light. Infrared radiation is not visibly perceptible but yet is ever present in our natural environment. All matter that generates heat from such diverse processes as radioactive decay, chemical decomposition, or metabolic processes emit infrared radiation. Within the spectrum of electromagnetic radiation, infrared radiation has wavelengths ranging from 0.75–3 micron (shortwave infrared)(SWIR), 3–5 micron (midwave infrared)(MWIR), 8–14 micron (longwave infrared)(LWIR), and 14–1000 micron (far infrared).

Transmission of infrared signals can be either through the natural atmosphere, gases, vapors, mists, or through condensed media such as liquids or solids (e.g., optical fibers or waveguides). Detection of these signals is then achieved with photoconductors and finally converted into perceptible information using light emitting diodes, liquid crystals, cathode ray tubes, or other visible light generators.

During the last few years, small bandgap semiconductors have become important in the fabrication of infrared detectors. Since it is difficult or impossible to produce p–n junctions by other means, ion implantation offers a promising alternative. For example, n-type doping occurs by proton irradiation of $Hg_{1-x}Cd_xTe$ (x=0.5,0.31;0.25) for the spectral range between 1.6 and 6 micron and PbTe and $Pb_{1-x}SnTe$ (x=0.12) for ranges up to 5 to 8 micron, respectively. In recent years ion cluster beam deposition and ion assisted deposition has been performed during epitaxy (i.e., layers having the desired doping are grown on a wafer) but no reports of using oxygen ion for doping lead chalcogenides are known to the present inventor.

Many semiconductors have band gaps less than 1 eV and, therefore, have thresholds in the infrared. For example, three lead salts, PbS, PbSe, and PbTe have band gaps on the order of between 0.2 eV and 0.4 eV. Some alloys such as $Hg_{1-x}Cd_xTe$, with x varying from 0 to 1, have band gaps ranging from 0.04 to 1.5 eV, which corresponds to wavelengths between 0.8 and 30 micron, covering essentially the entire infrared region. The preferred infrared detecting materials in the current art are lead chalcogenides such as lead sulfide, lead selenide, lead telluride, and lead/tin mixtures of these chalcogenides. Lead salts, especially lead selenide and lead sulfide materials, provide some of the most sensitive materials for detecting infrared energy at certain wavelengths. An infrared detector utilizing these materials usually comprises a thin film of lead selenide or lead sulfide on a substrate with electrical leads connected to opposite sides of the thin film or layer.

As with all transmission of data or information, it is advantageous to have the highest possible signal to noise ratio (S/N). However, in the case of low-cost infrared detectors currently available, the S/N values are inadequate, especially for weak signals being transmitted over great lengths.

When a semiconductor is subjected to photoexcitation of radiation flux with photon energies exceeding the band gap, an internal photochemical reaction occurs wherein the creation of electron-hole pairs form through the excitation of an electron from the valence band into the conduction band. The lifetime of the excited states typically ranges from $10^{-3}$ to $10^{-9}$ seconds. Upon illumination, the properties of the semiconductor are modified by the creation of these electron-hole pairs, increasing conductivity, known as photoconductivity. A direct correlation exists between the amount of photoconductivity and the light intensity impinging on the semiconductor photoelectric cell.

A mechanism for deleteriously limiting photoconductivity is known as "recombination", where the holes and free electrons collide and recombine with each other essentially annihilating the charge pair. Recombination occurs at all levels of detection and always reduces the efficiency of the irradiation process, the driving force for this process being electrical charge attraction. Methods of "trapping" one or both of the charge carriers have been devised that serve to reduce the rate of recombination and thereby make the photoconductive process more efficient. Free conduction electrons can theoretically be trapped by using "shallow traps" located in the forbidden zone between the conduction and valance bands of the semiconductor. These shallow traps comprise doubly charged anions such as oxide ions. Therefore, it is beneficial to incorporate such traps into the semiconductor matrix in order to increase the sensitivity of the photoconductor.

In order to manufacture photoconductors of the type discussed supra, the microelectronics industry makes great use of epitaxy, the crystalline growth of a thin film of semiconductors or semiconductor devices on a substrate of similar type. The substrate acts as a mechanical and thermal support, but must not short circuit the components. Thus substrates usually have very high electrical resistance.

The thin film of lead salt can be formed either by vacuum evaporation or deposition onto the substrate or by chemically depositing onto the substrate from solution. The vapor deposition technique has been found to be extremely difficult to control. On the other hand, a chemical deposition from solution technique also has been far from satisfactory in that frequently the precipitation of the lead salt has had poor adherence to the substrate.

Attempts have been made to increase sensitivity of these materials by incorporating oxygen into a doubly-ionized lattice site in the matrix by use of chemical vapor deposition. Once the lead salt is deposited on the substrate, it is sensitized by oxidizing. This is accomplished by maintaining the substrate and the lead salt at an elevated temperature in an air or oxygen atmosphere for a predetermined time. It is known in the industry that the sensitization of the lead salt material, such as a lead sulfide or lead selenide, is one of the more critical or more difficult processes to control. The sensitization process is the conversion or oxidation of the lead chalcogenide material using elevated temperatures and time. Generally, these prior art sensitization processes are difficult to reproduce and generate materials that are non-uniform. Any difference in the deposition process, the sensitization process, or environmental conditions can result in significant variation in performance and uniformity of the detector.

Air baking has only been able to incorporate the oxygen atoms into the surface layers and not into the bulk of the matrix. Therefore, the prior art processes suffer from an inability to routinely produce high S/N infrared detecting materials suitable for large focal plane arrays. Furthermore, the costs for carrying out these processes are high, in part due to the low process yields.

SUMMARY OF THE INVENTION

Having described the current state of the art and associated problems that still remain, it is an important object of the present invention to provide a process and materials to manufacture photoconductive infrared detectors, having a high S/N ratio.

It is another object of the present invention to provide a method for homogeneously incorporating oxygen sensitization centers into the bulk of a lead chalcogenide matrix without causing significant material damage.

It is another object of the present invention to produce infrared sensitive oxygen-doped lead chalcogenide films in a cost effective manner.

The current invention encompasses processes for manufacturing oxygen-doped lead chalcogenide films utilizing vacuum deposition and, optionally, either simultaneous or sequential ion implantation. Ion implantation is performed using low energy oxygen ions in order not to create serious surface defects as seen with other materials in the prior art.

Prior art methodologies (see, for example U.S. Pat. No. 5,410,452) employ chemical deposition of a lead chalcogenide such as lead selenide followed by a high temperature bake in the presence of oxygen, or an oxidant in solution, in an attempt to incorporate oxygen into the lead selenide matrix. It has been speculated that the oxygen atoms serve as efficient shallow electron traps and are responsible for the photoconductivity effects seen in chemically deposited single element lead selenide or sulfide. These electron traps, delay recombination of the holes and free electrons that are generated from the absorption of infrared light. In effect, recombination lowers the overall efficiency of the detector matrix even though absorption quantum yields remain high. Without being bound by theory, it is believed that these electron traps inhibit electron-hole recombination by temporarily trapping electrons and preventing them from interacting with the photo-generated holes. For every photogenerates hole that is swept in the contact region without recombining, a corner is injected into the preamplifier. If the photogenerated electrons are impeded in their drift to the opposite contact by the traps, then other holes must be injected into the semiconductor to maintain charge neutrality, leading to photoconductivity gain. In effect, this trapping effectively enhances the electron lifetime and slows electron transport, which results in greater photoconductivity gain. Researchers have also speculated that the number of trap sites is not enhanced in the chemically deposited material, but the number increases, due to natural occurrence of this type of defect. In high performance chemically deposited PbSe detectors, the photoconductive gain ranges from about 0.1 to about 5.

It is known, however, that prior art attempts to provide oxygen atom defects within the lead chalcogenide matrix produce poor quality matrices due to surface defects. Furthermore, the oxygen, rather than being incorporated homogeneously throughout the matrix, is located primarily at the matrix surface. This oxygen profile is not expected to significantly or optimally improve the sensitivity of the semiconductor to infrared absorption. Also, due to the defect (i.e., trap site) nature of this proposed sensitization mechanism, it is difficult to duplicate the prior art results, especially with fundamental changes in the process.

As part of the present invention, it is speculated that oxygen-based traps should be essentially homogeneously dispersed throughout the lead chalcogenide matrix to truly serve as an efficient shallow electron trap. The present invention provides several embodiments for accomplishing the homogeneous implantation of oxygen doping in lead chalcogenide matrices. These matrices thereby provide higher S/N ratios (in some cases by a factor of 2 or 3) for detection of infrared radiation than do identical samples without oxygen implantation. The implantation of oxygen atoms by ion implantation has been accomplished for certain materials such as silicon, but there is a dearth of information regarding implantation of oxygen into lead chalcogenide materials. Considering the known vagaries of the ion implantation process, and the paucity of general models predicting the location or nature of the dopant sites, the present invention provides unexpected and unobvious benefits to the art. For example, it is believed that when bulk implantation was achieved using prior art techniques, significant defects were also created to both the surface and the lattice of the matrix sufficient to destroy the utility of the semiconducting lead chalcogenide matrix.

DESCRIPTION OF THE PREFERRED EMBODIMENT

For the purposes of this invention, lead chalcogenides include: lead sulfide, lead selenide, lead telluride and mixtures thereof. Additionally, other Group IVB metals, such as germanium and tin, can also be present as their chalcogenides. These families of compositions have the chemical formulae $PbS_{1-x-y}Se_xTe_y$, wherein x and y can have values from 0 to 1 and x+y must be less than or equal to 1, and $Pb_bM_{1-b}S_{1-x-y}Se_xTe_y$, wherein b can have a value from 0 to 1 and M is tin. Elements such as germanium can be incorporated as a dopant at levels as low as parts per trillion in order to modify the electrical properties of the lead chalcogenide.

The inventive process begins with growth of a lead chalcogenide onto an essentially inert substrate comprising inorganic materials such as barium fluoride, silicon dioxide; organic polymeric materials such as polytetrafluoroethylene, polyethylenephthalate, polyamides; and glasses such as sapphire or quartz.

A given substrate is placed in an evacuated vacuum deposition chamber in which a lead chalcogenide in a containing vessel resides. The chamber is heated to allow the lead chalcogenide to evaporate and condense on the surface of the substrate. In this manner, growth of the lead chalcogenide occurs on the surface substrate. The growth of the lead chalcogenide on the substrate creates an essentially uniform coating comprising either amorphous, polycrystalline, or single crystal lead chalcogenide. In one embodiment, it is preferred to create polycrystalline lead chalcogenides due to the ease of formation and consequent cost savings due to higher yields. Useful coating thicknesses up to 5 to 10 micron can be achieved in this manner. Preferred thicknesses range from 0.5 to 2.0 micron. These features are also useful for the preferred embodiments described hereinbelow.

In one preferred embodiment, in situ ion implantation using oxygen ions is performed simultaneously with deposition of the lead chalcogenide. The ion implantation can be performed at lower energy than is typically performed because it is not necessary to penetrate deeply into the growing deposition as is required with for example, a prior art, post-deposition ex situ process. In essence, the ions must adhere to and react with the surface and essentially be overcoated with subsequently deposited lead chalcogenide. Some of the benefits of this process are that doping with oxygen is essentially homogeneous and that minimal surface or lattice damage to the deposited lead chalcogenide is observed, due to the low implantation energy and the constantly changing surface. A preferred voltage for oxygen ion implantation is less than 300 volts for in-situ beam enhanced simultaneous deposition compared to the alternative post ex-situ or in-situ deposition implantation where less than about $10^5$ volts is required.

The number of oxygen atoms, electron trap sites within the deposited lead chalcogenide matrix will affect the sensitivity of the lead chalcogenide to infrared irradiation. It has been determined that between $10^{12}$ and $10^{15}$ trap sites/cm$^3$ are useful in the present invention. Since some oxygen ions that bombard the surface of the matrix are retained within the matrix, the flow of oxygen ions must exceed the optimal trap sites in the final matrix.

In a second preferred embodiment, oxygen ions are implanted after the growth of the lead chalcogenide is completed. Implantation can be performed in situ (i.e., within the vacuum deposition chamber) or ex situ. In this embodiment, the voltage of the oxygen ion implantation must be kept minimal in order to avoid surface defects but sufficient to allow essentially uniform penetration with the deposited matrix. As in the first preferred embodiment, the number of trap sites is optimally between $10^{12}$ to $10^{15}$ trap sites/cm$^3$.

In both of the preferred embodiments discussed hereinabove, better uniformity and higher mobility of vacuum deposited materials is obtained by selectively creating the electron traps during or after the deposition process. The prior art, on the other hand, relies on random growth defects to incorporate oxygen during or after the growth process. The beam of oxygen ions supplied by an ion gun to create these advantageous traps can be modulated by choosing the appropriate beam energy to overcome activation barriers, and current to control the trap density. For example, when simultaneous implantation of oxygen ions is performed in-situ during the deposition of the lead chalcogenide materials, the ion energy is adjusted to maximize the probability that oxygen is essentially only incorporated on appropriate lattice sites to create effective electron traps. Typically, in this simultaneous implantation/deposition mode ion energies less than 300 V are required to achieve beneficial results. After deposition and ion implantation, the lead chalcogenide coating is annealed. Without being bound by theory, it is believed that the annealing process increases the size of the crystallites via recrystallization and thereby provides more carrier mobility due to fewer barriers, ultimately allowing the system to achieve higher gain.

Regardless of the formation process, a semiconductor being used in a photoconductive mode has a signal gain which depends linearly on the carrier mobility and lifetime. In prior art methodologies utilizing vacuum deposition, lower carrier mobility was observed as more oxygen was incorporated most likely due to incorporation into locations other than the preferred trapping sites. Vacuum deposition, as used in this invention, provides the capability of controlling the lifetime enhancing electron trapping mechanism and additionally provides material uniformity, enhanced mobility, and bandgap control.

In a third preferred embodiment, vacuum deposition is performed using at least two materials: one being the lead chalcogenide that will comprise the majority of the matrix, and a second component that is an oxygen containing lead, tin or germanium salt such as lead oxide, tin oxide, germanium oxide or the lead, tin, or germanium salts of a sulfur, selenium, or tellurium hydroxide or oxoacid. Examples include such materials as lead tellurate, lead selenate, lead sulfate, lead sulfite, lead peroxydisulfate, lanarkite (lead sulfate/lead oxide), tin(II)sulfate and tin(IV)sulfate. Incorporation of these materials can be either as their molecular entities or decomposition products thereof. When tin is the second component, useful ratios of the second component to the first component are approximately 0.1 to 10%, and a preferred range of ratios is between 0.5 and 3%. Doping the lead and or tin chalcogenide with germanium can be achieved by incorporating the germanium salts at levels above parts per trillion. Evaporation of these materials as cited in the general procedure described supra also provides an essentially homogenous doped lead chalcogenide semiconductor matrix.

Ion implantation offers a number of technological advantages which are important in fabricating a trapping mode photoconductor. These include such factors as reliability, controllability, homogeneity, and speed of trap creation. As known in the art, the acceleration energy used in ion implantation processes can be between a few thousand electron volts (keV) and several million electron volts (MeV). The penetration depth of the ions depends not only on the energy, but also upon the mass of the ions and the atomic mass of the target. Penetration depth can also be varied by manipulating the acceleration energy during the doping process. Unfortunately, ion implantation can also cause defects such as surface or internal radiation damage. The impact of channeling and diffusion also makes actual doping profiles difficult to predict theoretically. The damage induced by ion implantation can be observed in single crystal, polymorphic or amorphous solids and is especially problematic in polycrystalline materials where it is more difficult to observe.

Defect sites in vacuum deposited lead selenide (PbSe) due to oxygen ion implantation were achieved by applying a dose of $10^{13}$ oxygen ions/cm$^2$ having an energy of 100 KeV. The samples were processed according to the steps of annealing (recrystallization), detector delineation, contact deposition/delineation, and testing for efficacy in a calibrated blackbody measurement station. Following this process, an inventive sample exhibited nearly a 100% efficiency improvement.

The method of this invention does not entail labor-intensive work, such as growth of a single crystal and slicing of a grown crystal, which inevitably has been involved in the conventional technique. The film obtained by this method can be converted into a finished device simply by attaching electrodes thereto. Thus, the method of this invention enjoys an advantage also in terms of production cost.

USES OF INVENTIVE EMBODIMENTS

The physical embodiments derived from this inventive process are photo-semiconductors that require no cooling and can be used in applications that require the detection of infrared radiation, whether from natural or man-made sources. Specific applications include, but are not limited to: tracking and warning systems for moving objects such as satellites or missiles, television cameras, scanning optical images and converting them into electrical signals representative of the images, infrared detectors, qualitative and quantitative chemical analyses, IR absorption photometers, low level light detecting devices (single photon counters), and photo-switching materials in the field of optoelectronics.

Since other modifications and changes varied to fit particular operating requirements and environments will be apparent to those skilled in the art, the invention is not considered limited to the examples chosen for purposes of disclosure, and covers all modifications and changes which do not constitute departures from the true spirit and scope of this invention.

What is claimed is:

1. A vacuum deposition process for forming an infrared sensitive coating comprising the steps of:

placing a substrate comprising a major lateral surface and a source of lead chalcogenide salt in an evacuation chamber;

heating said chamber to effect evaporation of said source;

depositing evaporated lead chalcogenide salt on said major lateral surface to form a film; and ion implanting oxygen ions into said film, simultaneously with or subsequent to said depositing step;

wherein said evacuation chamber is maintained at less than about $10^{31\ 7}$ Torr and between about 23° and about 500° C.

2. The vacuum deposition process as recited in claim 1, wherein said film has a thickness ranging from about 0.5 to about 2 microns.

3. The vacuum deposition process as recited in claim 1, wherein said film comprises lead sulfide, lead selenide, lead telluride, or mixtures thereof and has the chemical formula $PbS_{1-x-y}Se_xTe_y$ wherein x and y has values from 0 to 1 and x+y is less than or equal to 1.

4. The vacuum deposition process as recited in claim 3, wherein said ion implanting is performed simultaneously with said deposition and said oxygen ions have energies less than a 1 kV.

5. The vacuum deposition process as recited in claim 3, wherein said ion implanting is performed subsequent to said deposition and said oxygen ions have energies greater than a 50 kV.

6. The vacuum deposition process as recited in claim 3, wherein said oxygen ions are implanted at about $10^{12}$ to $10^{15}$ cm$^{-3}$.

7. The vacuum deposition process as recited in claim 3, wherein said oxygen ions are implanted in order to dope said film with about $10^{-7}$ mol % oxygen atoms.

8. The vacuum deposition process as recited in claim 7, wherein said oxygen doping is essentially uniform within said film.

9. The vacuum deposition process as recited in claim 1, further comprising a Group IVB metal chalcogenide in said vessel.

10. The vacuum deposition process as recited in claim 9, wherein said film further contains a Group IVB metal, designated as M, wherein said deposited lead chalcogenide has the chemical formula $Pb_bM_{1-b}S_{1-x-y}Se_xTe_y$ wherein b can have a value from 0 to 1.

11. The vacuum deposition process as recited in claim 10, wherein said Group IVB metal comprises tin.

12. The vacuum deposition process as recited in claim 11, wherein said deposited lead chalcogenide salt is polycrystalline.

13. The vacuum deposition process as recited in claim 1, wherein said substrate comprises glass, organic polymers, or inorganic salts.

14. The vacuum deposition process as recited in claim 1, further comprising a vessel containing an oxygen containing lead, tin or germanium salt, and wherein said salt is deposited in said film either in molecular form or as a degradation product.

15. The vacuum deposition process as recited in claim 1, further comprising lead, tin, or germanium salts of a sulfur, selenium, or tellurium hydroxide or oxoacid, wherein said salts or oxoacid are deposited in said film either in molecular form or as a degradation product.

16. The vacuum deposition process as recited in claim 15, wherein said lead, tin, or germanium salts or oxoacid comprise lead tellurate, lead selenate, lead sulfate, lead sulfite, lead peroxydisulfate, lanarkite (lead sulfate/lead oxide), tin(II)sulfate and tin(IV)sulfate.

* * * * *